United States Patent [19]
Stanchak et al.

[11] Patent Number: 6,028,491
[45] Date of Patent: Feb. 22, 2000

[54] CRYSTAL OSCILLATOR WITH CONTROLLED DUTY CYCLE

[75] Inventors: Carl M. Stanchak; Michael J. Seymour, both of Colorado Springs, Colo.

[73] Assignee: Atmel Corporation, San Jose, Calif.

[21] Appl. No.: 09/069,696

[22] Filed: Apr. 28, 1998

[51] Int. Cl.[7] .............................. H03B 5/36; H03B 5/04; H03B 1/00; H03L 1/00; H03L 1/02

[52] U.S. Cl. ........................... 331/75; 331/158; 331/175; 331/176; 327/175

[58] Field of Search .................. 331/66, 74, 75, 331/111, 116 FE, 143, 158, 175, 176; 332/109, 110; 375/238; 327/175

[56] References Cited

U.S. PATENT DOCUMENTS

| | | | |
|---|---|---|---|
| 4,152,675 | 5/1979 | Jett, Jr. ................................. | 331/116 R |
| 4,544,897 | 10/1985 | Ishikawa . | |
| 5,081,428 | 1/1992 | Atriss et al. .............................. | 331/57 |
| 5,081,429 | 1/1992 | Atriss et al. .............................. | 331/57 |
| 5,349,311 | 9/1994 | Mentzer .................................... | 331/57 |
| 5,457,429 | 10/1995 | Ogawa et al. ............................ | 331/57 |
| 5,477,180 | 12/1995 | Chen ....................................... | 327/175 |
| 5,481,228 | 1/1996 | Badyal ..................................... | 331/74 |
| 5,546,055 | 8/1996 | Klughart ................................. | 331/116 |
| 5,907,254 | 5/1999 | Chang ...................................... | 327/165 |

OTHER PUBLICATIONS

Erica A. Vittoz et al., "High–Performance Crystal Oscillator Circuits: Theory and Application", *IEEE Journal of Solid–State Circuits*, vol. 23, No. 3 (Jun. 1988) pp. 774–783.

*Primary Examiner*—David Mis
*Attorney, Agent, or Firm*—Thomas Schneck; Rosalio Haro

[57] ABSTRACT

An oscillator circuit having a first node oscillating with a first indeterminate duty cycle and having a second node oscillating with a predetermined second duty cycle. Both nodes oscillate at similar frequencies. A variable current source and a switch are coupled in series between Vcc and ground with the output of the variable current source being the second node. The first node controls the switch, which is closed when the first node is at a first logic state and is opened when it is at a second logic state. During each cycle, a monitoring circuit measures the time span that the first node is at the first logic state and adjusts the magnitude of the variable current source to make it directly proportional to the measured time span. By adjusting the variable current source, the second node can be made to reach a desired voltage level in a desired amount of time during each cycle. In a second embodiment, a current limiting transistor is inserted between the second node and the switch. The current limiting transistor is controlled by the monitoring circuit and is made to reduce the influence of the switch on the second node as the duty cycle of the first node approaches the predetermined second duty cycle.

39 Claims, 7 Drawing Sheets

CRYSTAL OSCILLATOR WITH CONTROLLED DUTY CYCLE

FIELD OF THE INVENTION

The invention relates to crystal oscillators having adjustable and stable duty cycles at any given frequency.

BACKGROUND OF THE INVENTION

With reference to FIG. 1, a basic oscillator consists of an inverting amplifier 4 and an 180° phase shift feedback network 6. If desired, a non-inverting amplifier 8 may be placed at the output of inverting amplifier 4 to shape the oscillator's output. Although inductor-capacitor, LC, networks would typically be desirable in the construction of a phase shift feedback network, inductors are generally not available in integrated circuits. Therefore, FIG. 1 shows a more practicable phase shift feedback network 6 made up of three RC network sub-stages 1–3. Each sub-stage 1–3 includes a resistor 10 and a capacitor 12, and is capable of almost a 90° phase shift. This high phase shift, however, comes at the expense of high signal attenuation. Therefore, three stages 1–3 are typically necessary to obtain an 180° phase shift with adequate loop gain. Such RC networks, however, have a relatively low quality factor, Q, as compared to LC networks or quartz crystals.

Quartz is a piezoelectric crystalline material with a regular atomic structure that can be distorted by the application of a mechanical or electromagnetic force. If an electric field is applied to a piece of quartz, the crystal lattice distorts just as if a mechanical force were applied. The electrical appearance of quartz crystals is that of a passive two-terminal devices whose impedance varies with frequency. This gives it a resonant quality having a Q value and frequency stability orders of magnitude better than even those achievable with LC circuits. As a result, quartz crystals are often used as fixed-frequency oscillators for providing a digital clock in integrated circuits.

FIG. 2 shows a Pierce crystal oscillator, which is based on the phase shift oscillator of FIG. 1, with a crystal 14 replacing one of the resistors in the phase shift feedback network 6. At a desired series resonance, crystal 14 looks resistive, and a suitable choice of capacitor values can cause the crystal to oscillate. Since the crystal has a far steeper phase frequency relation than the rest of the network, it is the dominant controller of the frequency. The Pierce oscillator, however, is rarely used in this form. Instead, a minimize version of this crystal resonator is most commonly used as clock oscillators in digital systems.

FIG. 3 shows a minimized Pierce oscillator 11 using a logic inverter 13 to replace inverting amplifier 4 of FIG. 2. Inverter 13 consists of pmos transistor 15 and nmos transistor 17. Resistor 21 provides DC negative feedback to bias the gates of transistors 15 and 17 into their linear region. The resonating properties of crystal 19 typically cause oscillation where the crystal appears inductive, at a point offset from the series feedback resonance. Although the feedback network of resistor 21 and crystal 19 appears to have less than a 180° phase shift, the crystal's inductive behavior makes up for any missing phase shift and thereby achieves oscillation.

The basic Pierce oscillator 11 of FIG. 3 does have some drawbacks. First, the crystal's frequency tends to vary with temperature and age. In addition, the Pierce oscillator inherently has difficulty maintaining a 50% duty cycle. Digital systems typically require a 50% duty cycle with a ±5% deviation error margin. To adjust the crystal period to a 50% duty cycle, the output of a quartz oscillator is typically applied to a frequency divider or frequency multiplier, not shown. If a frequency multiplier is used, however, any frequency errors in the crystal are also multiplied. If a frequency divider is used, then the crystal needs to oscillate at a frequency much higher than that required by the digital system. This increases the crystal's power consumption and susceptibility to error.

It is therefore desirable to provide a quartz crystal oscillator circuit which can directly produce a sustained stable 50% duty cycle at a desired frequency. This is especially true in systems having reduced power supply levels where circuit complexity and power consumption must be maintained at a minimum.

U.S. Pat. No. 5,481,228 to Badyal discloses a Pierce crystal oscillator circuit similar to that of FIG. 3, but which provides a 50% duty cycle. Badyal explains that if the CMOS inverter 13 used in the feedback circuit maintains an equal pull-up and pull-down current sourcing capability, the output may maintain a 50% duty cycle, but then explains that process variations make it very difficult to achieve inverters having exactly the same pull-up and pull-down currents. Badyal therefore discloses a feedback inverter having a composite pull-up circuit whose current sourcing capability is digitally adjustable, and a composite pull-down circuit whose current sinking capability is likewise digitally adjustable. Badyal's inverter can digitally connect multiple pmos transistors in parallel to form one composite pull-up device. Each of the multiple pmos devices has different resistive and gain characteristics so that the current sourcing capability of the composite pull-up device can be digitally adjusted. Similarly, multiple nmos transistors can be digitally connected in parallel to form one composite pull-down circuit. Badyal compares the output from the composite CMOS inverter with a reference voltage. The result of the comparison is fed into a logic decoder whose outputs digitally adjust the number of pmos and nmos devices connected in parallel until a 50% duty cycle is achieved. This approach, however, increases the complexity and power consumption of the Pierce oscillator. Furthermore, Badyal does not address the added difficulties of maintaining sustained oscillation in low power circuits.

With reference to FIG. 4, U.S. Pat. No. 5,546,055 to Klughart discloses a Pierce oscillator 11 consisting of a CMOS inverter 13, a crystal 19, two capacitors 23 and 25, and a nonlinear feedback network 21. Nonlinear feedback network 21 consists of two resistors 27 and 28 connected between capacitors 23 and 25, and having a third capacitor 29 coupling the junction of resistors 27 and 28 to ground. Klughart explains that low power Pierce crystal oscillators operating in the weak inversion region have a reduced frequency response when operating at low frequencies. The reduced frequency response may reduce the oscillator's loop gain below a minimum value necessary for sustained oscillation. To compensate for this, nonlinear feedback network 21 provides negative feedback at low frequencies and inhibits it at high frequencies. This approach, however, is susceptible to variations in the power supply and does not provide a sustained 50% duty cycle.

An article entitled "High-Performance Crystal Oscillator Circuit: Theory and Application" by Vittoz et al. in *IEEE Journal of Solid-State Circuits*, Vol. 23, No. 3, pages 774–783, discloses a different approach toward achieving a Pierce crystal oscillator which can sustain oscillation at low $V_{DD}$ power levels. With reference to FIG. 5, an embodiment of the circuit proposed by Vittoz et al. is shown to substantially follow the structure of a basic Pierce oscillator consisting of a CMOS inverter 13, crystal 19 and feedback resistor 21 connected in parallel, and two frequency adjusting capacitor 23 and 25 coupling either end of crystal 19 to ground. The basic difference is the use of a current source 30 to maintain the current level and amplitude of the circuit to within a critical region of operation. Vittoz explains that due to the inherent class AB operation of digital inverter 13, Pierce crystal oscillators without a current source 30 experiences current increases with rising amplitudes of oscillation. This creates strong nonlinear effects which result in poor frequency stability and a large waste of power. Bias current 30 is selected such that the amplitude is low enough to avoid significant distortion and thereby reduces nonlinear effects, while still being above a critical value necessary for sustained oscillation. The oscillator disclosed by Vittoz et al., however, has an inherently low duty cycle and can therefore not generate a 50% duty cycle. Vittoz et al. suggest using a frequency divider chain to digitally adjust the oscillator's frequency and its duty cycle.

It is an object of the present invention to provide a low voltage crystal oscillator with an adjustable duty cycle.

It is a further object of the present invention to provide a crystal oscillator having a stable duty cycle which does not require the use of frequency dividers.

It is also an object of the present invention to provide a low power crystal oscillator with a sustained 50% duty cycle.

SUMMARY OF THE INVENTION

The above objects have been met in a circuit which receives a first oscillating signal having a first frequency and a first duty cycle, and outputs a second oscillating signal of the same frequency but having a predetermined second duty cycle. The first oscillating signal is preferably a crystal oscillating signal generated by a crystal oscillator circuit. The crystal oscillator circuit includes a crystal and a resistor coupled in parallel with a capacitor coupling either end of the crystal to ground. A transistor is connected with its source electrode coupled to ground, its drain coupled to one end of the crystal and its control gate coupled to the other end of the crystal. A current source is coupled between $V_{DD}$ and the drain of the transistor. The magnitude of the current source is selected such that the crystal oscillator maintains sustained oscillation at a low power consumption.

The circuit of the present invention further includes a variable current source and a switching means, preferably an MOS transistor, connected in series between $V_{DD}$ and ground. One end of the variable current source is coupled to $V_{DD}$ and the other end forms an intermediate output node. The crystal oscillating signal from the crystal oscillator circuit is applied to a control input of the switching means such that the switching means is closed when the crystal oscillating signal is at a first logic state, and the switching means is opened when the crystal oscillating signal is at a second logic state. When the switching means is closed, it provides a quick and constant pull-down rate of the intermediate node to ground. When the switching means is opened, the intermediate output node is free to be pulled up toward $V_{DD}$ at a rate determined by the variable current source. The magnitude of the variable current source is controlled by a duty cycle monitoring means.

The duty cycle monitoring means observes the crystal oscillating signal being applied to the switching means and generate a magnitude control output proportional to the time that the crystal oscillating signal is at said first logic state during each cycle. The longer that the oscillating signal is at the first logic state, the more the magnitude control output will increase the current of the variable current source. Thus, the pull-up rate of the intermediate output node is increased as the duty cycle of the input oscillator signal is increased.

The current of the variable current source is adjusted such that the intermediate output node always requires the same predetermined amount of time within each cycle to reach a predetermined voltage level. This predetermined amount of time is selected to establish a desired second duty cycle at the intermediate output node, and is maintained constant by means of the duty cycle monitoring means.

In a preferred embodiment, the duty cycle monitoring means is coupled to observe the intermediate output node directly. The duty cycle monitoring means includes a logic inverter that is coupled to receive the intermediate output node as an input. The output from the logic inverter is coupled to the input of a current starved inverter. The current starved inverter receives a first control current which controls its pull-up rate, and receives a second control current which controls its pull-down rate. By adjusting the ratio of the first control current to the second control current, one can adjust the predetermined second duty cycle at the intermediate output node. The current starved inverter is preferably applied to the variable current source via a low pass filter.

The preceding circuit is an efficient structure for increasing the duty cycle of the crystal oscillating signal from the crystal oscillator, but may not be very efficient at reducing the duty cycle of the crystal oscillating signal. A second embodiment of the present invention incorporates a small modification which permits the structure to both increase and decrease the duty cycle of the crystal oscillating signal while maintaining an efficient use of power.

In a second preferred embodiment of the present invention, a current limiting transistor is inserted between the intermediate output node and the switching means. This current limiting transistor is responsive to the same magnitude control output that is applied to the variable current source. By proper construction of the current limiting transistor, it can be made to function either in its linear region and behave like variable resistor or be made to function in its saturation region and behave like a switch. In either case, when the duty cycle of the crystal oscillator signal has gone beyond the predetermined second duty cycle, the duty cycle monitoring means causes the current limiting transistor to increasingly isolate the intermediate node from the switching means. Thus, even if the crystal oscillator signal remains at said first logic state beyond a predetermined point in time and thereby maintains the switching means closed, the current limiting transistor would have already reduced, or prevented, the influence of the switching means on the intermediate output node. The variable current source is then free to pull up the intermediate output node toward the predetermined voltage level and achieve the desired predetermined second duty cycle without having to overcome the pull-down action of the switching means.

In still an alternate embodiment, a variable resistor is inserted between $V_{DD}$ and the variable current source. The variable resistor is controlled by a power and temperature insensitive control circuit, which thereby provides a level of immunity to power and temperature variations to the variable current source. The sensitivity of the entire structure to power and temperature variations is thereby reduced.

BEST MODE FOR CARRYING OUT THE INVENTION

Figure 1:
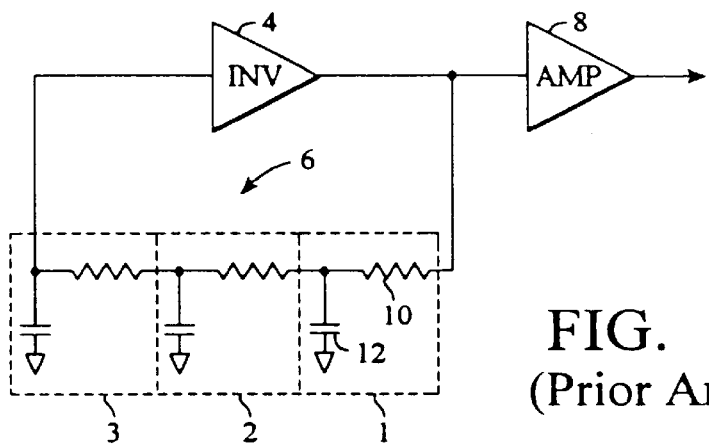
FIG. 1 is a basic prior art oscillator.
Figure 2:
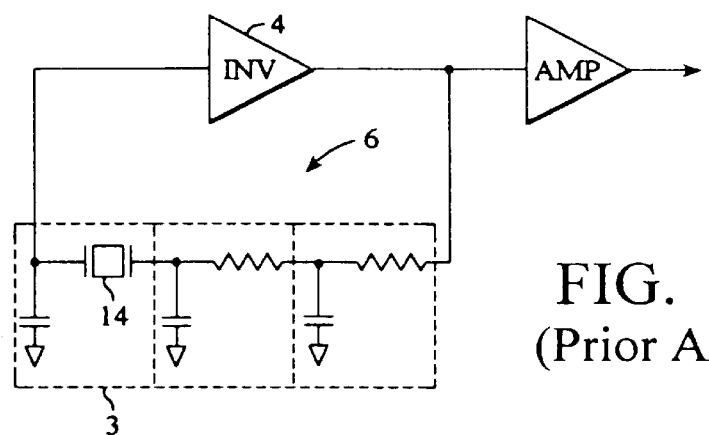
FIG. 2 shows a prior art Pierce crystal oscillator.
Figure 3:
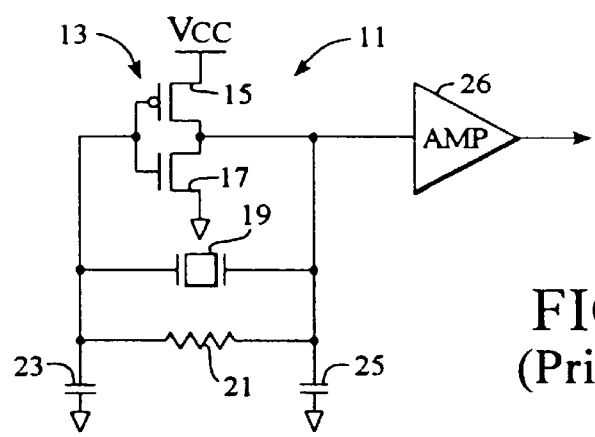
FIG. 3 shows a minimized prior art Pierce crystal oscillator.
Figure 4:
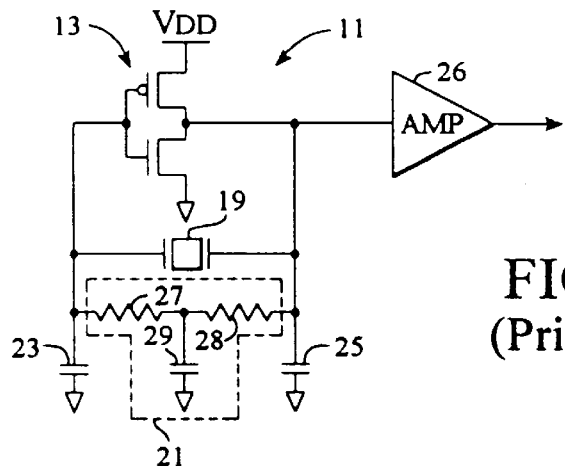
FIG. 4 shows a prior art Pierce crystal oscillator having a nonlinear feedback network.
Figure 5:
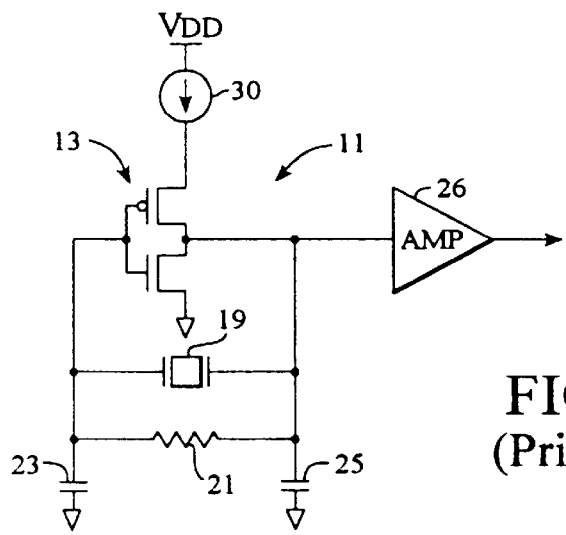
FIG. 5 shows a prior art Pierce crystal oscillator for use with a low power supply.
Figure 6:
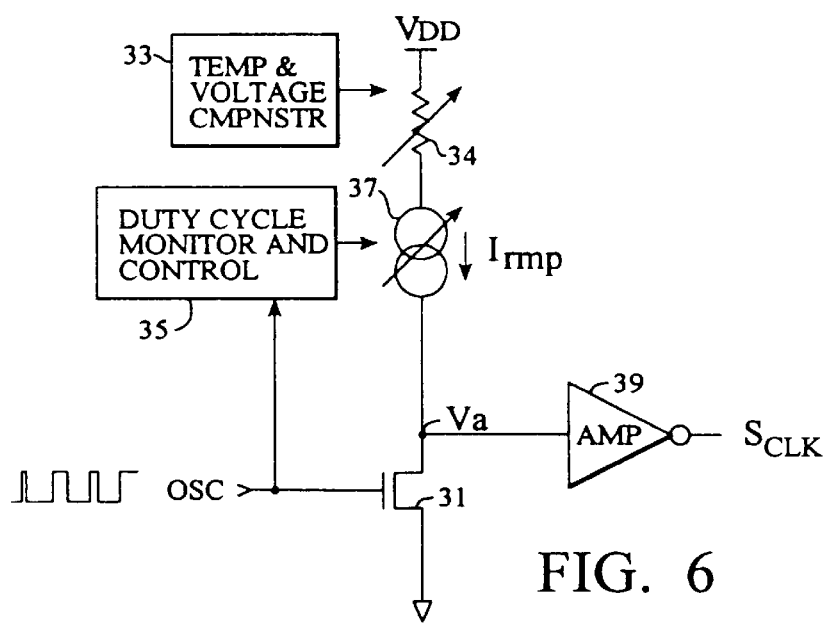
FIG. 6 is a first embodiment of the present invention shown receiving a pulse sequence.

With reference to FIG. 6, a first embodiment of the present invention receives a pulse sequence, OSC, from an oscillator source such as from a Pierce crystal oscillator. Pulse sequence OSC preferably has a duty cycle other than 50%. As is typical of Pierce crystal oscillators, the present example shows a pulse sequence having a varying duty cycle below 50%. Pulse sequence OSC is applied to the control gate of an nmos pull-down transistor 31 and to a duty cycle monitor and control circuit 35. Pulse sequence OSC alternates between a logic high state and a logic low state. Pull-down transistor 31 responds to a logic high by quickly coupling node Va to ground, and responds to a logic low by isolating node Va from ground. When node Va is isolated from ground, it is pulled up toward $V_{DD}$ at a rate dependent on a ramp-up current $I_{rmp}$ supplied by a variable current source 37. The magnitude of $I_{rmp}$ is controlled by duty cycle monitor and control circuit 35.

Duty cycle and monitor circuit 35 responds to the duty cycle ratio of pulse sequence OSC by adjusting the magnitude of $I_{rmp}$ in a manner proportional to the amount of time that pulse sequence OSC is at a logic high during each cycle. The longer the time that OSC stays at a logic high during a cycle, the higher the magnitude of $I_{rmp}$ supplied by variable current source 37. As the magnitude of ramp-up current $I_{rmp}$ is increased, the rise time of node Va is likewise increased. Thus, the ramp-up speed of Va will increase with a growing OSC duty cycle up to a maximum ramp-up rate determined by the maximum $I_{rmp}$ supplied by variable current source 37.

Node Va is applied to an amplifier 39 which shapes the final output clock signal $S_{CLK}$. Amplifier 39 responds to a ramping down to ground of node Va by quickly pulling high output clock signal $S_{CLK}$. Since the pulling down of node Va is controlled by pull-down transistor 31, which has a constant and fast pull-down rate, amplifier 39 likewise has a quick output high response time to a ramping down of node Va. However, since the ramping up rate of node Va is controlled by variable current source 37, amplifier 39 does not respond to a ramping up of node Va until node Va reaches the threshold voltage, Vth, of amplifier 39.

Duty cycle monitor and control circuit 35 adjusts ramp-up current $I_{rmp}$ such that node Va reaches the threshold level Vth of amplifier 39 at the same time during each cycle regardless of the duty cycle of pulse sequence OSC. If, for example, OSC is at a logic high for only 25% of a cycle, i.e. it has duty cycle of 25%, then duty cycle monitor and control circuit 35 will decrease ramp-up current $I_{rmp}$ to slow down the ramping up rate of node Va such that node Va reaches the threshold voltage Vth of amplifier 39 at the midpoint of the cycle period. This brings the duty cycle of output signal $S_{CLK}$ up to 50%. If OSC is at a logic high for a full 50% of a duty cycle, then duty cycle monitor and control 35 will increase ramp-up current $I_{rmp}$ to a high magnitude and speed up the ramping up rate of node Va. This causes Va to quickly reach the threshold voltage Vth of amplifier 39 and thereby maintain output signal $S_{CLK}$ at a duty cycle of about 50%. In this way, the response time of amplifier 39 to a ramping up signal on node Va can be adjusted such that the output $S_{CLK}$ of amplifier 39 is maintained at any predetermined duty cycle.

The embodiment of FIG. 6 further includes a means for compensating for temperature and voltage variations. A temperature and voltage compensating circuit 33 adjusts a variable resistance 34 to limit the maximum current magnitude of $I_{rmp}$. In this way, the maximum ramp up rate, controlled by variable current source 37, is increased or decreased as appropriate to maintain a stable oscillation performance in spite of variations in the power supply or temperature. It should be noted that the magnitude of $I_{rmp}$ can also affect the pull-down rate of node Va if both variable current source 37 and pull-down transistor 31 are active at the same time. Thus, $I_{rmp}$ could also be used to reduce the duty cycle of $S_{CLK}$, if desired.

Figure 7:
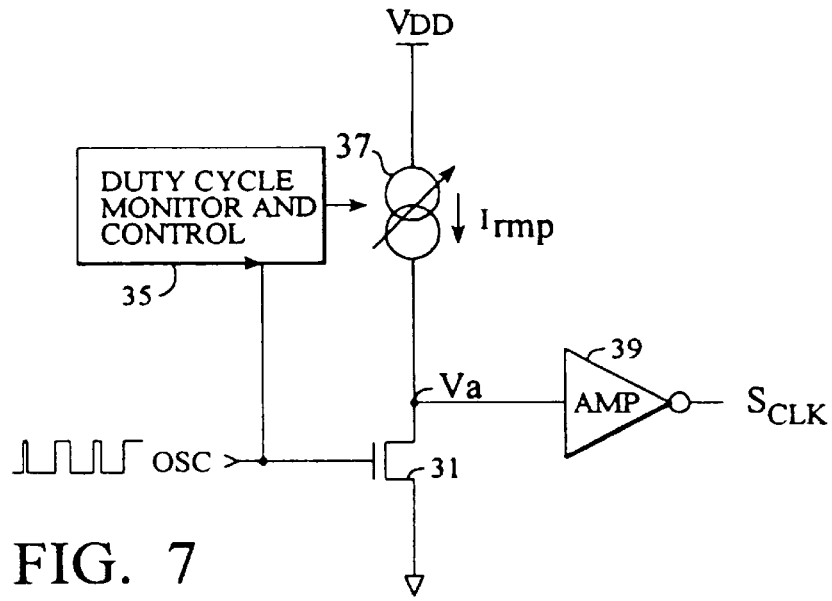
FIG. 7 is a duty cycle control circuit as shown in FIG. 6, but without the temperature and voltage compensation components shown in FIG. 6.

The embodiment of FIG. 6 is reconstructed in FIG. 7 without the temperature and voltage compensating circuit components 33 and 34 of FIG. 6. As explained above, the temperature and voltage compensating circuits adjust the maximum ramp-up and ramp-down speeds, but the circuit of FIG. 7 shows only the main mechanism by which the duty cycle is adjusted. To better illustrate the operation of the circuit of FIG. 7, FIG. 8 portrays simplified exemplary voltage levels at specific nodes during various stages of operation.

Figure 8:
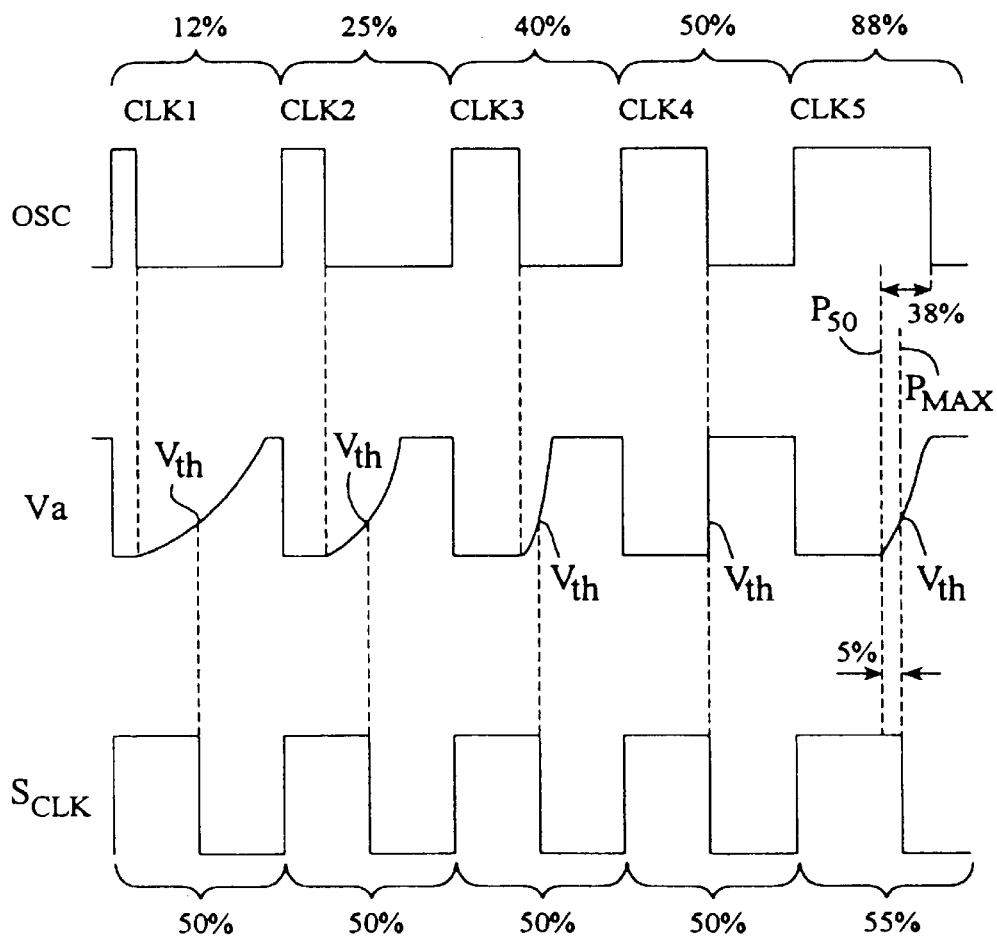
FIG. 8 portrays simplified exemplary voltage levels at specific nodes of the circuit of FIG. 7 during various stages of operation.

FIG. 8 shows node Va and output signal $S_{CLK}$ for five simplified clock cycles CLK1–CLK5 of pulse sequence OSC. During CLK1, OSC is shown to have a 12% duty cycle. When CLK1 first goes high, pull-down transistor 31 turns on and quickly brings node Va down to ground. Amplifier 39 responds by taking $S_{CLK}$ to a logic high. After 12% of the period of CLK1 has elapsed, OSC is shown to go to a logic low. This turns off pull-down transistor 31 and node Va is free to be pulled up toward a logic high by variable current source 37.

The amount of time necessary for Va to reach the threshold voltage Vth of amplifier 39 is controlled by duty cycle monitor and control circuit 35. Duty cycle monitor and control circuit 35 responds to the 12% duty cycle of OSC by reducing the current sourcing magnitude of variable current source 37. In the present example, current $I_{rmp}$ is adjusted such that Va reaches Vth when half the period of OSC has elapsed. As a result, node Va is shown to have a slow ramp-up time. When node Va reaches the Vth of amplifier 39, output signal $S_{CLK}$ is brought back to a logic low and thereby establishes a 50% duty cycle.

During CLK2, OSC is shown to have a 25% duty cycle. In order for node Va to reach the Vth of amplifier 39 at 50% of the period, duty cycle monitor and control circuit 35 responds to the longer pulse of OSC by increasing $I_{rmp}$ accordingly. Node Va therefore ramps up toward a logic high at a faster rate and again reaches Vth at a point in time midway its period and establishes a 50% duty cycle for output signal $S_{CLK}$.

In CLK3, OSC is shown to have a 40% duty cycle. When OSC goes to a logic low and turns off pull-down transistor 31, node Va has only 10% of the period to reach Vth at the 50% mark and thereby maintain a 50% duty cycle at $S_{CLK}$. To more quickly raise the voltage of node Va, duty cycle monitor and control circuit 35 responds to the longer OSC pulse by adjusting variable current source 37 to establish a high $I_{rmp}$ magnitude sufficient to raise node Va to Vth in at least the required 10% of the period time. Therefore, node Va again reaches Vth at the midpoint of the period and again maintains a 50% duty cycle at $S_{CLK}$.

In CLK4, OSC is shown to already have a 50% duty cycle. This means that variable current source 37 does not need to introduce any delay to the ramping up rate of node Va. Duty cycle monitor and control circuit 35 therefore responds to the 50% duty cycle of OSC by adjusting variable current source 37 to its maximum magnitude. This raises node Va at its maximum rate without introducing any added delay and quickly brings output signal $S_{CLK}$ to a logic low and maintains a 50% duty cycle.

During CLK5, OSC is shown to have a duty cycle of 88%. In the present embodiment, it is desirable to maintain a 50% duty cycle±5%. This means that output signal $S_{CLK}$ should not demonstrate a duty cycle greater than 55%. As explained above, duty cycle monitor and control circuit 35 increases the magnitude of variable current source 37 as long as pulse OSC is high. Therefore, the longer that OSC is high, the higher the magnitude of variable current source 37. But in order to maintain a maximum duty cycle of for example 55%, duty cycle monitor and control circuit 35 responds to OSC reaching its 50% point by raising $I_{rmp}$ of variable current source 37 to its maximum magnitude. In a first embodiment, the maximum level of $I_{rmp}$ is sufficient to pull-up node Va toward a logic high at a predetermined rate in spite of OSC still being at a logic high and pull-down transistor 31 being on. This predetermined rate is such that it requires no more than 5% of a period to raise node Va up to Vth while pull-down transistor 31 is active. Thus, no matter how much the duty cycle of OSC goes beyond 55%, amplifier 39 will see node Va reach Vth at the 55% point and maintain a maximum duty cycle of 55%. This method of adjusting for an input duty cycle greater than a desired value, however, requires that variable current source 37 be able to source a large maximum current in order to overcome pull-down transistor 31.

Figure 9:
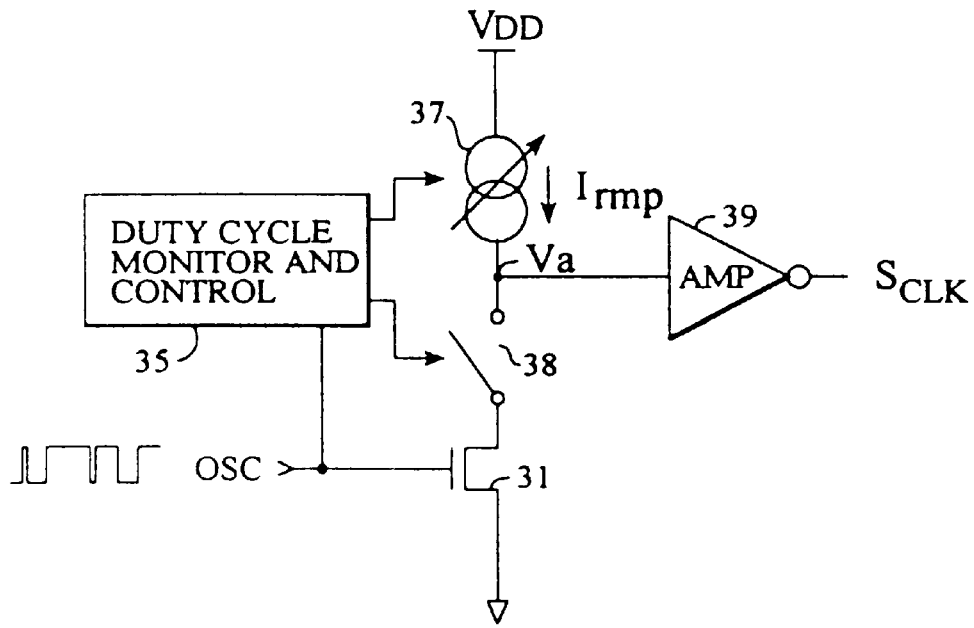
FIG. 9 is a second embodiment of the present invention.

A second embodiment of the present invention, shown in FIG. 9, can compensate for a duty cycle less than and greater than a desired value without requiring a larger variable current source 37. All elements in FIG. 9 similar to those of FIG. 7 have similar reference characters and are described above. In FIG. 9, a switch 38 is inserted between node Va and pull-down transistor 31. Switch 38 is controlled by duty cycle and monitor and control circuit 35. As long as oscillator signal OSC remains below 50%, duty cycle monitor and control circuit 35 maintains switch 38 closed. In this instance, the resulting circuit of FIG. 9 behaves substantially the same as that of FIG. 7 and thereby compensates for OSC signals having duty cycles below a desired value of, for example, 50%. If oscillator signal OSC reaches a duty cycle equal to or greater than 50%, duty cycle monitor and control circuit 35 responds by opening switch 38. Thus, although oscillator signal OSC may remain at a logic high beyond the 50 percentile of the duty cycle causing pull-down transistor 31 to remain actuated, switch 38 responds by isolating node Va from the influence of pull-down transistor 31. In the meantime, variable current source 37 would have been raised to its maximum magnitude and thereby quickly pull node Va up toward $V_{DD}$. Since variable current source 37 does not need to overcome the pull-down action of transistor 31, it does not require an excessive maximum $I_{rmp}$ magnitude and thus does not increase its power consumption.

Figure 10:
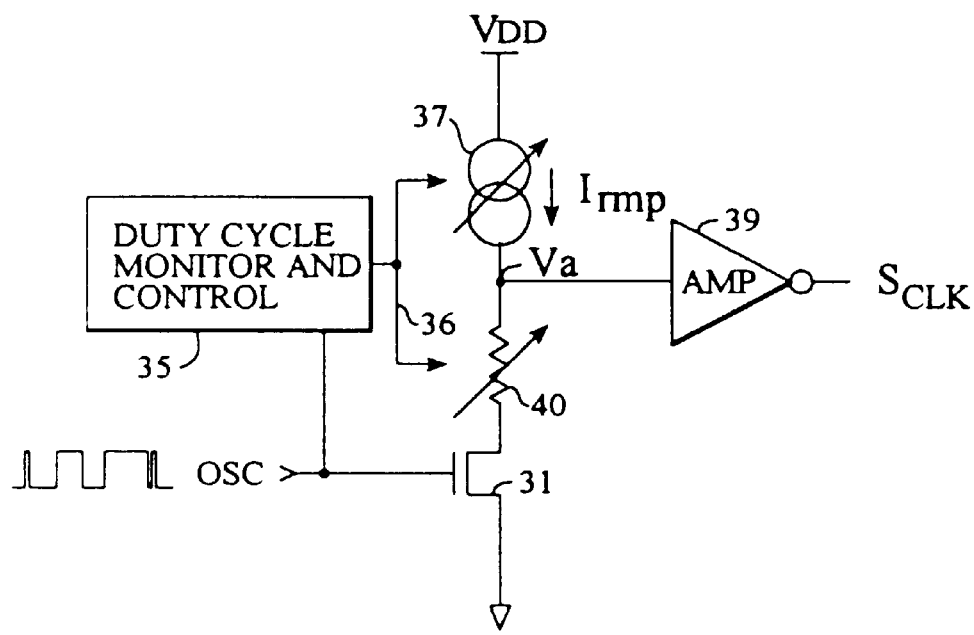
FIG. 10 is a third embodiment of the present invention.

A third embodiment of the present invention is shown in FIG. 10. All elements in FIG. 10 similar to those of FIG. 7 have similar reference characters and are described above. The embodiment of FIG. 10 can likewise compensate for duty cycles both greater than and less than a desired value while not requiring a large maximum $I_{rmp}$ magnitude. In FIG. 10, a variable resistor 40 is inserted between node Va and pull-down transistor 31. Duty cycle monitor and control circuit 35 controls both variable current source 37 and variable resistor 40 by means of the same control signal 36. As explained earlier, the output from duty cycle monitor and control circuit 35 is proportional to the duty cycle of oscillator signal OSC. That is, control signal 36 will increase the magnitudes of both variable current source 37 and variable resistor 40 in response to an increasing duty cycle on OSC. As oscillator signal OSC approaches a desired duty cycle of, for example 50%, variable current source 37 increase it current magnitude while variable resistor 40 increases its resistance and thereby decreasing the influence of pull-down transistor 31 on node Va. Therefore, variable current source 37 does not need an excessive maximum current in order to overcome pull-down transistor 31 and pull node Va up toward $V_{DD}$ in a prerequisite amount of time. In fact, the current sourcing magnitude of variable current source 37 may be reduced due to the current limiting action of variable resistor 40 while OSC is below a desired duty cycle value.

Figure 11:
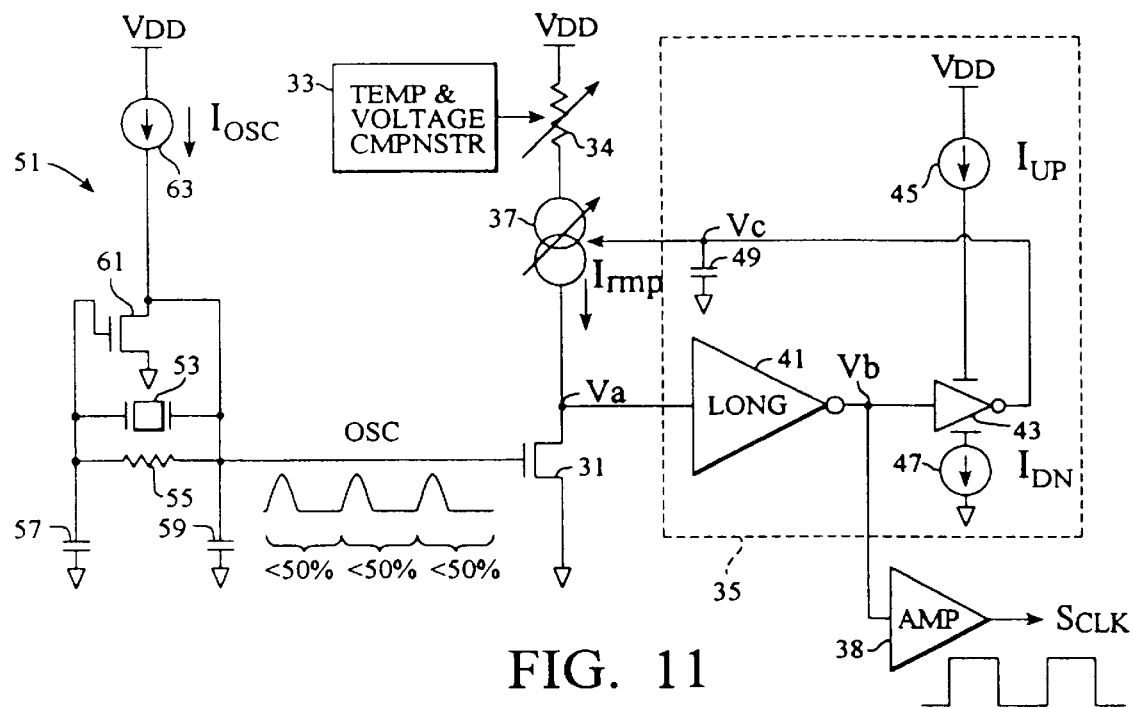
FIG. 11 is a first circuit implementation of the structure of FIGS. 6 and 7.

With reference to FIG. 11, a first circuit implementation of the structure of FIGS. 6 and 7 is shown. In FIG. 11, pulse sequence OSC is generated by a modified Pierce crystal oscillator 51 having a duty cycle less than 50%. Furthermore, duty cycle monitor and control circuit 35 is shown to monitor pulse sequence OSC indirectly by observing node Va at the output of variable current source 37. Like in FIGS. 6 and 7, a temperature and voltage compensator circuit 33 controls a variable resistor 34 to adjust the maximum magnitude of $I_{rmp}$ in response to temperature and power variations. Also like in FIGS. 6 and 7, variable current source 37 is controlled by duty cycle monitor and control circuit 35, which together establish the ramp-up rate for node Va. An output of duty cycle monitor and control circuit 35 is coupled to the input of a non-inverting amplifier 38 which produces an output signal $S_{CLK}$ having a pulse sequence following that of OSC.

The Pierce crystal oscillator 51 of the present invention includes a crystal 53 and a feedback resistor 55 connected in parallel with capacitors 57 and 59 respectively coupling either end of crystal 53 to ground. One end of crystal 53 is coupled to the control input of a transistor 61 and the other end of crystal 53 is coupled to the drain of transistor 61. The drain of transistor 61 receives an oscillation bias current $I_{OSC}$ from a current source 63. $I_{OSC}$ is selected so as to maintain oscillation at low voltages and low power. Transistor 61 is preferably operated in weak inversion to provide a maximum value of transconductance for a given bias current $I_{OSC}$. When $I_{OSC}$ exceeds a critical value dependent on the transconductance of transistor 61, oscillation will build up but the amplitude of OSC will stop rising at some maximum value below $V_{DD}$. The present Pierce crystal oscillator 51 thus maintains sustained oscillation at low power, but intrinsically produces a pulse sequence OSC having a low voltage magnitude and a first duty cycle substantially below 50%. However, the circuit of the present invention increases the first duty cycle of Pierce crystal oscillator 51 up to a predetermined second duty cycle of preferably 50%±5% and reshapes OSC to proper rail to rail voltage swings.

In the embodiments of FIGS. 6 and 7, duty cycle monitor and control circuit 35 was shown to monitor pulse sequence OSC directly at the control gate of pull-down transistor 31. In the present embodiment of FIG. 11, however, duty cycle monitor and control circuit 35 is shown to monitor pulse sequence OSC indirectly by observing the subsequent behavior of node Va at the drain of pull-down transistor 31, which inversely follows pulse sequence OSC. In this manner, the duty cycle monitor and control circuit 35 of FIG. 11 can establish a feedback mechanism to more easily control variable current source 37. Since the embodiment of FIG. 11 observes node Va directly, it can more accurately assure that node Va reaches a predetermined voltage level at a predetermined time during each cycle.

Duty cycle monitor and control circuit 35 in FIG. 11 includes a long inverter 41 receiving node Va. Inverter 41 is long enough to limit power loss in generating logic signal swings. The output of inverter 41 is coupled to the input of non-inverting amplifier 38 and is also coupled to the input of a current starved inverter 43. A pull-up current $I_{UP}$ supplied by current source 45 controls the swing high rate of current starved inverter 43, and the swing low rate of current starved inverter 43 is controlled by a pull-down current $I_{DN}$ supplied by a current sink 47. As is more clearly explained below, the ratio of the pull-up current $I_{UP}$ and pull-down current $I_{DN}$ controls the duty cycle of output signal $S_{CLK}$. Thus, by proper selection of $I_{UP}$ and $I_{DN}$, output signal $S_{CLK}$ can be made to have any desired duty cycle. In the present embodiment, however, $I_{UP}$ and $I_{DN}$ are selected to have equal current magnitudes so as to establish a 50% duty cycle at $S_{CLK}$.

The output of current starved inverter 43 is coupled to a low pass filter consisting of capacitor 49 at node Vc. Capacitor 49 effectively establishes a control voltage at node Vc which controls the current magnitude of variable current source 37. In the preferred embodiment of FIG. 11, the voltage at node Vc is inversely related to the current magnitude of variable current source 37. That is, the lower the voltage value at node Vc, the higher the current magnitude produced by variable current source 37. Similarly, the higher the voltage at node Vc, the lower the current magnitude produced by variable source 37. If for example, current starved inverter 43 brings node Vc up to $V_{DD}$, then variable current source 37 would supply its minimum current, or no current at all. If node Vc were brought down to ground, then variable current source 37 would supply its maximum current. The operation of the embodiment of FIG. 11 is illustrated with reference to simplified diagrams of voltage swings at various circuit nodes identified in FIG. 12.

Figure 12:
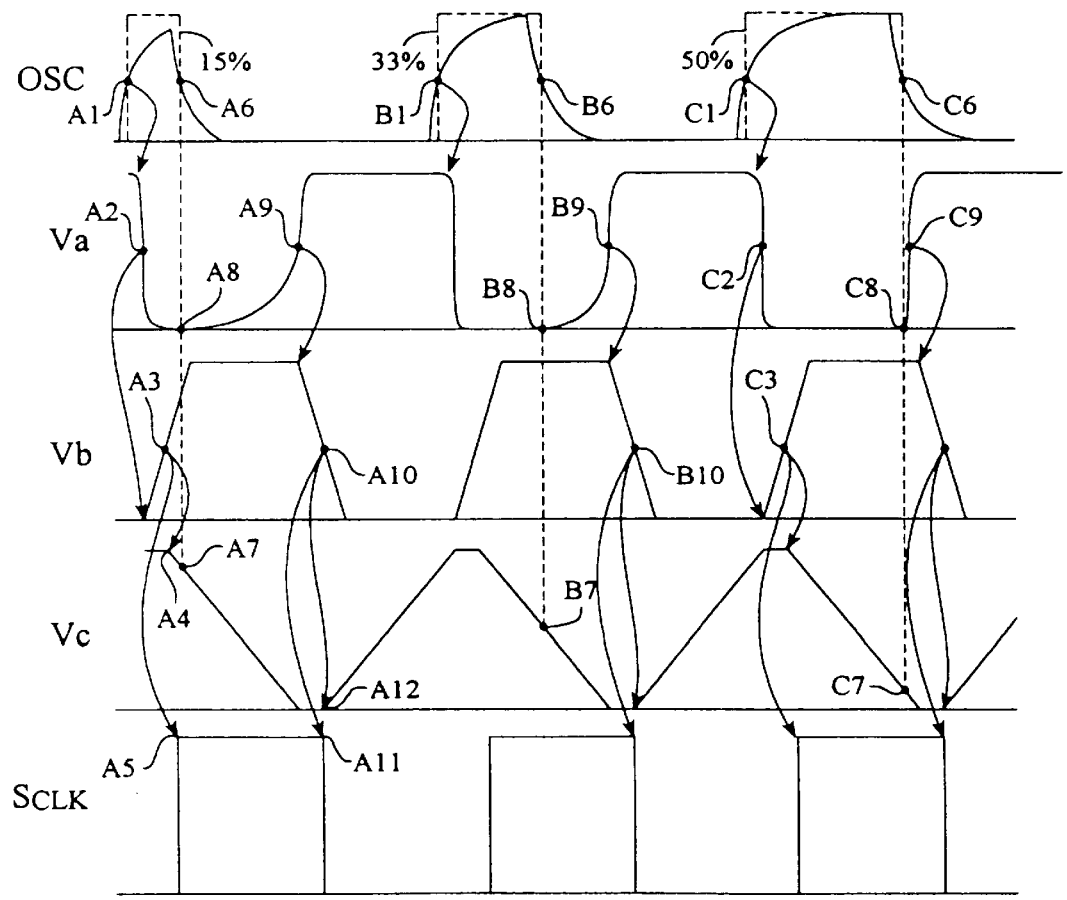
FIG. 12 shows simplified diagrams of voltage swings at various nodes of the circuit shown in FIG. 11.

With reference to FIG. 12, three simplified pulses of OSC are shown having a 15%, 33% and 50% duty cycle, respectively. For the sake of brevity, the following discussion assumes that the threshold voltage of all the identified devices is at the midpoint between a logic low of ground potential and a logic high of $V_{DD}$. Stated differently, threshold voltage Vth is assumed to be $\frac{1}{2}V_{DD}$ for all circuit elements. It is to be understood by those versed in the art that in practice it may be necessary to adjust the threshold levels of various circuit elements to achieve a desired operation. Selection of these threshold variations, however, is typically made under circuit simulation conditions and is considered to be within the scope of those versed in the art.

Considering the first diagrammatic pulse of OSC having a 15% duty cycle, at the time when pulse OSC reaches the threshold voltage of pull-down transistor 31 at point A1, node Vc is shown to be at is maximum voltage of, for example $V_{DD}$, meaning that variable current source 37 has its lowest current magnitude or is completely turned off. Since there is no pull-up current $I_{rmp}$ coming from variable current source 37, pull-down transistor 31 responds to OSC reaching point A1 by quickly dropping node Va to ground, as shown. When node Va drops to the threshold level of long inverter 41 at point A2, long inverter 41 responds by ramping its output at node Vb up from ground toward $V_{DD}$. Node Vb is coupled to current starved inverter 43 and to non-inverting amplifier 38. When node Vb reaches threshold point A3, non-inverting amplifier 38 responds by quickly bring up output signal $S_{CLK}$ toward $V_{DD}$ as shown at point A5, and current starve inverter 43 begins ramping down node Vc, as shown at point A4. Node Vc will continue to ramp downward until node Vb switches from a logic high to logic low.

As shown in FIG. 12, the end of the first OSC pulse is taken at the point when OSC drops to the threshold level of pull-down transistor 31 at point A6. At this point, pull-down transistor 31 is turning off and this allows node Va to be pulled up by variable current source 37. When OSC is at point A6, node Vc has not had time be lowered very much as shown at point A7. Therefore, variable current source 37 supplies a small current. This slows down the ramping up of node Va considerably. However, since long inverter 41 is responsive to node Va, which for the moment remains below its threshold voltage, inverter 41 maintains its output Vb at a logic high causing current starved inverter 43 to continue lowering node Vc toward ground. As node Vc is lowered, the magnitude of variable current source 37 is increased. The voltage at node Va thus exponentially increases from point A8 to point A9, which is the threshold level of long inverter 41. Pull-down current sink 47, shown in FIG. 11, is selected such that node Va reaches point A9 at the half-way point of one complete cycle and thereby establishes a 50% duty cycle. When node Va reaches point A9, long inverter 41 responds by ramping downward node Vb. As node Vb passes threshold point A10, non-inverting amplifier 38 responds by quickly switching from a logic high to a logic low, as indicated by point A11. Similarly, current starved inverter 43 responds by beginning its slow ramping up sequence shown at point A12.

By the time the second sample pulse of OSC begins to ramp up and reaches threshold point B1, node Vc has been fully charged up to its maximum voltage, as indicated at point B4. Therefore, variable current source 37 is again set at its minimum current magnitude. This permits pull-down transistor 31 to respond to point B1 by quickly pulling down node Va from a logic high to a logic low, since it is not opposed by any sizable pull-up current from variable current source 37. If pull-up current source 45 were adjusted such that node Vc were not at its maximum voltage by the time OSC reached point B1, the pull-down action of transistor 31 would be slowed down by $I_{rmp}$ and the effective duty cycle would be reduced. But in the present example the objective is to increase the OSC duty cycle up to 50%. Therefore, variable current source 37 is made weak at the beginning of each period so as to permit node Va to be quickly pulled down to ground. The lowering of node Va toward ground causes long inverter 41 to begin ramping up node Vb from ground toward $V_{DD}$. This in turn causes non-inverting amplifier 38 to switch high output signal $S_{CLK}$, and also causes current starved inverter 43 to begin the ramping down action of node Vc.

Pulse sequence OSC is shown to come back down to threshold point B6 after 33% of the period has elapsed. By the time OSC reaches point B6, node Vc is shown have ramped downward considerably to point B7 such that variable current source 37 is now at a much higher current source capability than in the previous cycle. Therefore, node Va is shown to more quickly ramp upward from point B8 to B9, the threshold voltage of long inverter 41.

Long inverter 41 responds to node Va reaching point B9 by ramping down node Vb from a logic high to a logic low. When node Vb reaches the threshold level of current starved inverter 43 and non-inverting amplifier 38 at point B10, output signal $S_{CLK}$ is switched downward and node Vc begins its ramping up sequence. Again, output signal $S_{CLK}$ maintains a 50% duty cycle.

Referring to the third sample pulse of OSC having a 50% duty cycle, when OSC reaches threshold point C1, variable current source 37 is again sourcing a minimum current and pull-down transistor 31 quickly brings node Va to a logic low. Long inverter 41 responds to node Va reaching threshold point C2 by initiating its ramping up of node Vb. When node Vb reaches point C3, output signal $S_{CLK}$ is brought up and node Vc begins its ramping down sequence. By the time OSC reaches it ramp down threshold at point C6, node Vc is shown at point C7 to be at a much lower voltage potential and thereby causes variable current source 37 to source a much larger current magnitude than before. Thus, when OSC is at C6 and pull-down transistor 31 is shutting off, variable current source 37 has a large current magnitude and quickly ramps node Va upward from point C8 to point C9. This creates a corresponding quick response on the part of long inverter 41, which begins its ramping down sequence of node Vb. Non-inverting amplifier 38 responds to the lowering of node Vb by bringing down output signals $S_{CLK}$ and again maintaining a duty cycle of about 50%. Similarly, current starved inverter 43 responds to the lowering of node Vb by initiating its ramping up sequence of node Vc in preparation for the next cycle.

If pulse sequence OSC were to having a duty cycle larger than 50%, then node Vc would reach its lowest voltage level corresponding to variable current source 37 having its maximum current magnitude before the turning off of pull-down transistor 31. In an alternative embodiment, variable current source 37 is made to have a maximum current magnitude sufficient to raise node Va toward the threshold value of long inverter 41 even while pull-down transistor 31 is active and thereby prevents the duty cycle of output signal $S_{CLK}$ from going to far beyond 50%. In this alternate embodiment, the maximum current magnitude of variable current source 37 is preferably selected such that output signal $S_{CLK}$ maintains a maximum duty cycle not exceeding 55%.

Figure 13:
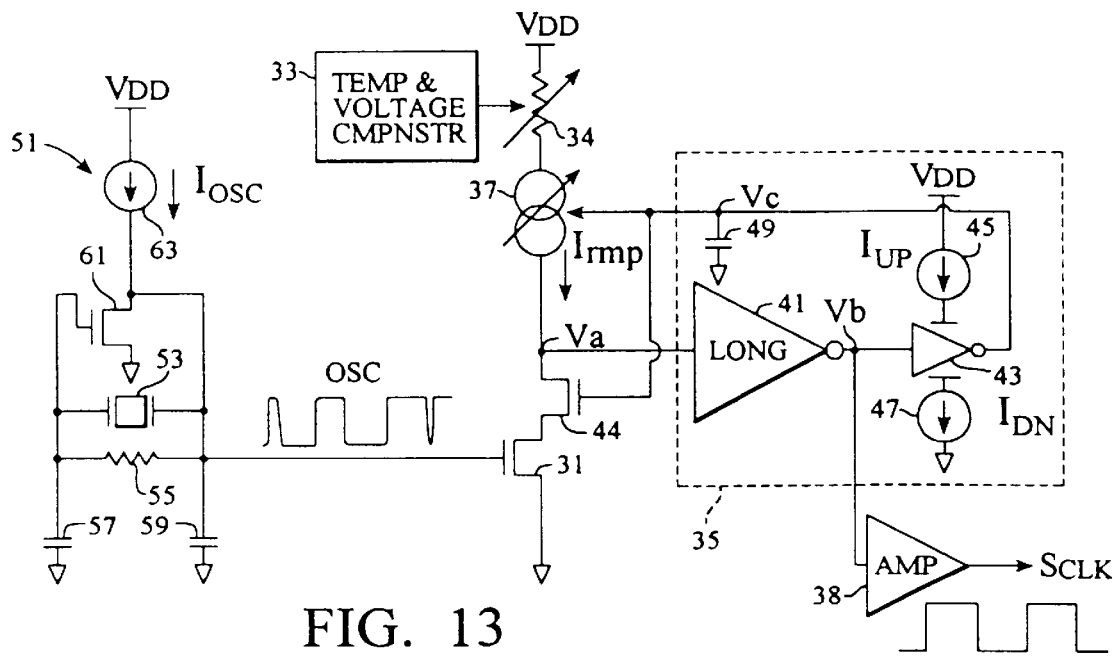
FIG. 13 is a sample circuit implementation suitable for the circuit diagrams shown in FIGS. 9 and 10.

An alternate embodiment shown in FIG. 13 is better suited for compensating an oscillating signal OSC both below and above a predetermined second duty cycle of preferably 50%. The structure of FIG. 13 is a sample circuit implementation suitable for the circuit diagrams of both FIGS. 9 and 10. All elements in FIG. 13 similar to those in FIG. 11 are given similar reference characters and are discussed above.

Figure 14A:
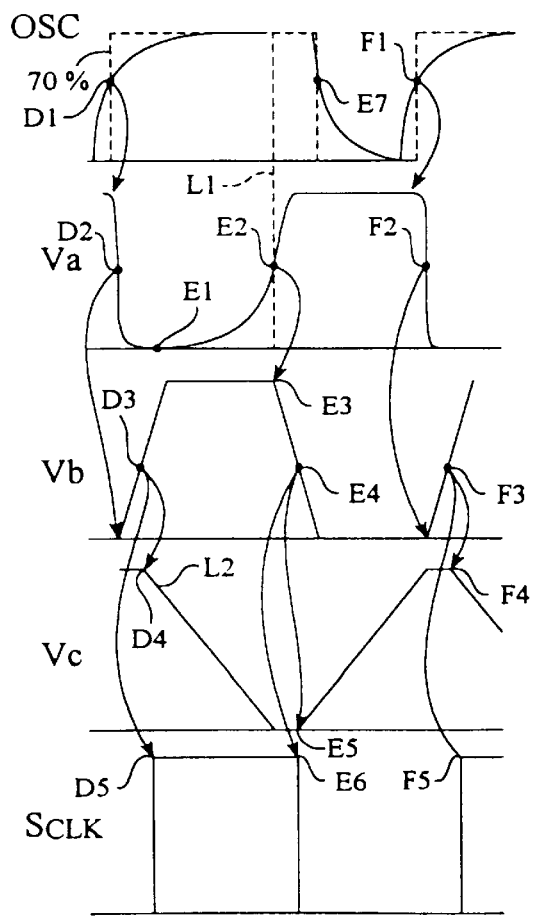
FIG. 14A shows simplified voltage swings for when the sample circuit of FIG. 13 is operated as shown in FIG. 10.

In FIG. 13, an isolating transistor 44 is inserted between node Va and pull-down transistor 31. By proper construction of isolating transistor 44, it can be made to operate in its saturated region and function as the switch 38 of FIG. 9. Alternatively, transistor 44 can be made to operate in its linear region, in which case it would function as the variable resistor 40 of FIG. 10. In the circuit implementation of FIG. 13, oscillating signal OSC is again observed indirectly at node Va by duty cycle monitor and control circuit 35. FIG. 14A shows simplified voltage swings for when isolating transistor 44 is implemented as a variable resistor, and FIG. 14B illustrates simplified voltage swings for when isolating transistor 44 is operated as a switch.

With reference to FIG. 14A, a sample OSC signal with a 70% duty cycle is shown. As in the previous example of FIG. 11, node Vc is at a maximum voltage at the beginning of a cycle. This causes variable current source 37 to be at its minimum current, and causes isolating NMOS transistor 44 to be turned on and supply a minimal resistance. Under these conditions, pull-down transistor 31 responds to OSC reaching threshold level D1 by quickly bringing down node Va. As node Va reaches the threshold voltage of long inverter 41 at point D2, node Vb begins to swing upward. Current starved inverter 43 responds to node Vb reaching point D3 by starting its pull-down of node Vc at point D4. Similarly, non-inverting amplifier 38 responds to point D3 by raising output signal $S_{CLK}$ to a logic high at point D5.

The lowering of node Vc by current starved inverter 43 causes isolating transistor 44 to begin turning off and increasingly isolate node Va from pull-down transistor 31. Meanwhile, the current sourcing magnitude of variable current source 37 is increased. As shown, this causes node Va to begin swinging upward from point E1 toward point E2 even while signal OSC remains high and pull-down transistor 31 remains on. Preferably, node Va ramps from point E1 to point E2 in an amount of time sufficient for establishing a predetermined second duty cycle indicated by line L2 of, for example, 50%. Long inverter 41 responds to node Va reaching point E2 by swinging low node Vb at point E3. As node Vb reaches the threshold voltage of current starved inverter 43 at point E4, node Vc begins its ramping up sequence. Concurrently, non-inverting amplifier 38 responds to node Vb reaching point E4 by switching low output signal $S_{CLK}$ at point E6. By the time signal OSC begins ramping down and reaches point E7, 70% of the period has elapsed. At this point, pull-down transistor 31 responds by turning off, but as shown in FIG. 14A, node Va will have already reached a logic high before point E7.

Figure 14B:
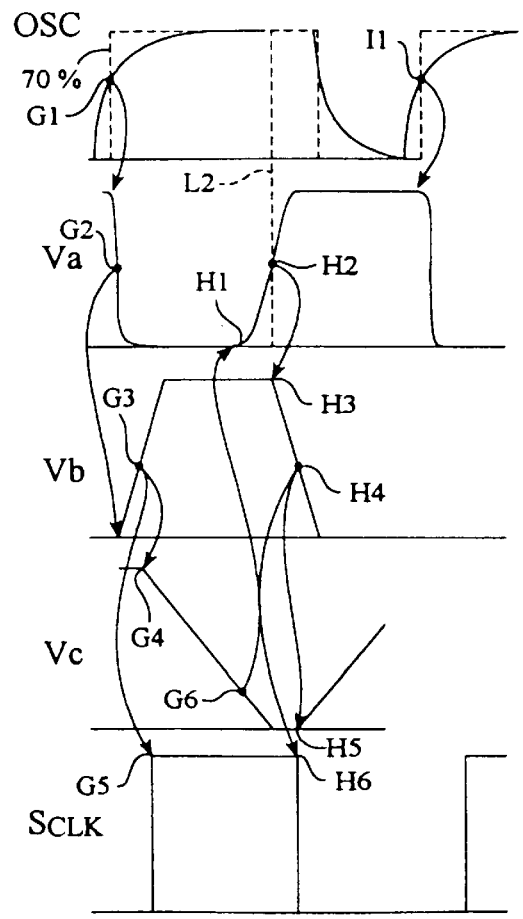
FIG. 14B shows simplified voltage swings for when the sample circuit of FIG. 13 is operated as shown in FIG. 9.

In FIG. 14B, diagrammatic voltage swings are shown for isolating transistor 44 being operated as a switch. In this case, the behavior of the circuit of FIG. 13 is the same as that of FIG. 11 as long as isolating transistor 44 remains closed. As oscillating signal OSC reaches threshold point G1, node Vc is shown to be at its maximum level and pull-down transistor 31 responds by quickly pulling node Va down to ground. As Va passes point G2, long inverter 41 responds by bringing up node Vb. At point G3, non-inverting amplifier 38 brings output signal $S_{CLK}$ to a logic high and current starved inverter 43 begins ramping down node Vc.

In this case, the threshold voltage of isolating transistor 44 is made low such that it does not switch to an open condition, OFF, until almost half the period has elapsed, as shown by line L2. While isolating transistor 44 is closed, node Va remains at a logic low as node Vc drops in spite of variable current source 37 being slowly increased because pull-down transistor 31 remains ON, that is, closed. As node Vc reaches the threshold voltage of isolating transistor 44 at point G6, transistor 44 begins to turn off and isolate node Va from pull-down transistor 31 at point H1. As node Va is isolated from pull-down transistor 31, variable current source 37 is able to more quickly raise node Va from point H1 to point H2 and maintain a 50% duty cycle at point Va. Long inverter 41 responds to point H2 by beginning its ramp down sequence at node Vb. In this manner, non-inverting amplifier 38 responds to point H4 indicating that half the period has elapsed by bringing output single $S_{CLK}$ down and maintaining a 50% duty cycle. Current starved inverter 43 responds by bringing up node Vc in preparation for the next cycle.

Figure 15:
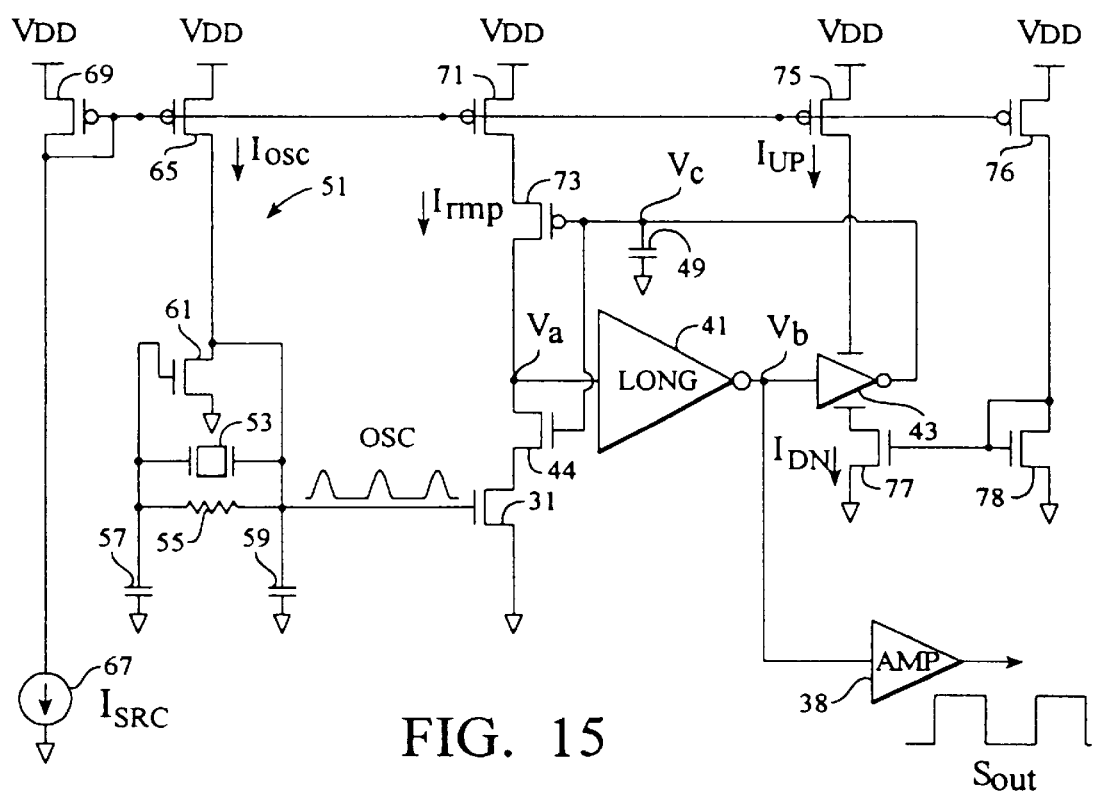
FIG. 15 is a more complete circuit implementation of the embodiment of FIG. 13.

With reference to FIG. 15, a more complete circuit implementation of the embodiment of FIG. 13 is shown. As would be understood by one versed in the art, the specific sub-circuit structures shown in FIG. 15 is likewise applicable to the embodiment of FIG. 11. All elements similar to those of FIGS. 11 and 13 are identified by similar reference characters and are explained above. Pierce crystal Oscillator 51 receives bias current $I_{OSC}$ from pmos transistor 65. Bias current $I_{OSC}$ is mirrored from a control current $I_{SRC}$ coming from a current sink 67. Current sink 67 is power and temperature independent, and the size ratio of pmos transistors 69 and 65 establishes the required magnitude of bias current $I_{OSC}$ while also making $I_{OSC}$ temperature and power independent. Control current $I_{SRC}$ is also mirrored to produce ramp-up current $I_{rmp}$, pull-up current $I_{up}$, and pull-down current $I_{DN}$. Pmos transistor 71 takes the place of variable resistor 34 of FIG. 13 and mirrors the temperature and power independent current $I_{SRC}$ to establish the maximum permissible magnitude of $I_{rmp}$. Similarly, pmos transistor 75 mirrors $I_{SRC}$ to produce $I_{UP}$. Pmos transistor 76 and nmos transistor 78 together mirror current $I_{SRC}$ from current sink 67 to nmos transistor 77, which produces pull-down current $I_{DN}$. By adjusting the size ratios of transistors 75–78, one can adjust the ratio of $I_{UP}$ to $I_{DN}$, and thereby adjust the duty cycle of output signal $S_{OUT}$, as explained above. Variable current source 37 of FIG. 13 is implemented in FIG. 15 by means of pmos transistor 73. In keeping with the above discussion, as the voltage at its control gate is lowered, the current magnitude of pmos transistor 73 is increased, and vice versa.

We claim:

1. An oscillator with controlled duty cycle comprising:
   a first power rail and a second power rail;
   a variable current source having a first terminal, a second terminal and a first control input, said first terminal being coupled to said first power rail, said second terminal being coupled to an intermediate output node;
   a switching means having a third terminal and a fourth terminal, and further having a second control input for receiving an oscillating signal having a first duty cycle and oscillating between a first logic state and a second logic state, said third terminal being coupled to said intermediate output node, said fourth terminal being coupled to said second power rail, said switching means being effective for closing and coupling said third terminal to said second power rail in response to said oscillating signal being at said first logic state and effective for opening and isolating said third terminal from said second power rail in response to said oscillating signal being at said second logic state;
   a duty cycle monitoring means including a logic inverter, a current starved inverter, a first constant current source having a first control current, and a second constant current source having a second control current, said logic inverter being responsive to said intermediate output node, the output of said logic inverter being coupled to said current starved inverter, said current starved inverter having a pull-up rate dependent on said first control current and having a pull-down rate dependent on said second control current, said current starved inverter being effective for generating a magnitude control output;
   coupling means for coupling said magnitude control output to said first control input of said variable current source, said variable current source being effective for generating a current magnitude proportional to said magnitude control output, the ratio of said first control current to said second control current being effective for establishing a predetermined second duty cycle at said intermediate output node.

2. The oscillator of claim 1, wherein said current magnitude generated by said variable current source in response to said magnitude control output is effective for raising said intermediate node to a predetermined voltage value in a predetermined amount of time during each cycle of said oscillating signal.

3. The oscillator of claim 2, wherein said variable current source has a maximum current magnitude sufficient for raising said intermediate output node to said predetermined voltage value in said predetermined amount of time while said switching means is closed.

4. The oscillator of claim 1 further including a variable resistor coupled between said first terminal of said variable current source and said first power rail, said variable resistor being responsive to a power and temperature insensitive control circuit.

5. The oscillator of claim 1 further including a variable resistor coupled between said intermediate output node and said third terminal of said switching means, said variable resistor being responsive to said magnitude control output.

6. The oscillator of claim 1 further including a second switching means coupled between said intermediate output node and said third terminal of said first switching means, said second switching means being responsive to said duty cycle monitoring means and effective for isolating said intermediate output node from said first switching means in response to said oscillating signal being at said first logic state for a predetermined amount of time.

7. The oscillator of claim 6 wherein said second switching means is responsive to said magnitude control output from said duty cycle monitoring means.

8. The oscillator of claim 1 wherein said intermediate output node is coupled to an amplifier.

9. The oscillator of claim 1 further including a non-inverting amplifier circuit responsive to said logic inverter and effective for producing an output clock pulse having a duty cycle substantially similar to said predetermined second duty cycle.

10. The oscillator of claim 1 wherein said coupling means for coupling said magnitude control output to said first control input of said variable current source is a low pass filter.

11. The oscillator of claim 10 wherein said low pass filter includes a capacitor coupled between said first control input of said variable current source and said second power rail.

12. The oscillator of claim 1 further including a crystal oscillator circuit for producing said oscillating signal, said crystal oscillator circuit including a crystal, a resistor, a first capacitor, a second capacitor, a transistor, and a constant current source;

said crystal and said resistor being coupled in parallel between a first oscillator node and a second oscillator node, said first capacitor being coupled between said first oscillator node and said second power rail, said second capacitor coupled between said second oscillator node and said second power rail;

said transistor having a source electrode, a drain electrode and a control gate, said source electrode being coupled to said second power rail, said drain electrode being coupled to said second oscillator node and said control gate being coupled to said first oscillator node, said constant current source being coupled between said drain electrode and said first power rail.

13. An oscillator with controlled duty cycle comprising:

a first power rail and a second power rail;

a variable current source having a first terminal, a second terminal and a first control input, said first terminal being coupled to said first power rail, said second terminal being coupled to an intermediate output node;

a transistor having a third terminal and a fourth terminal, and further having a second control input for receiving an oscillating signal having a first duty cycle and oscillating between a first logic state and a second logic state, said third terminal being coupled to said intermediate output node, said fourth terminal being coupled to said second power rail, said transistor being turned ON and moving the voltage potential at said third terminal toward said second power rail at a fixed rate in response to said oscillating signal being at said first logic state and being turned OFF and isolating said third terminal from said second power rail in response to said oscillating signal being at said second logic state;

a duty cycle monitoring means including a logic inverter, a current starved inverter, a first constant current source having a first control current, and a second constant current source having a second control current, said logic inverter being responsive to said intermediate output node, the output of said logic inverter being coupled to said current starved inverter, said current starved inverter having a pull-up rate dependent on said first control current and having a pull-down rate dependent on said second control current, said current starved inverter being effective for producing a magnitude control output, the ratio of said first control current to said second control current being effective for establishing a predetermined second duty cycle at said intermediate output node;

coupling means for coupling said magnitude control output to said first control input of said variable current source, said variable current source being effective for generating a current magnitude proportional to said magnitude control output and effective for moving the voltage potential of said intermediate output node toward said first power rail at a rate dependent on said current magnitude.

14. The oscillator of claim 13, wherein said current magnitude generated by said variable current source in response to said magnitude control output is effective for raising said intermediate node to a predetermined voltage value in a predetermined amount of time during each cycle of said oscillating signal.

15. The oscillator of claim 14, wherein said variable current source has a maximum current magnitude effective for raising said intermediate node to said predetermined voltage value in said predetermined amount of time while said transistor is ON.

16. The oscillator of claim 13 further including a variable resistor coupled between said first terminal of said variable current source and said first power rail, said variable resistor being responsive to a power and temperature insensitive control circuit.

17. The oscillator of claim 13 further including a variable resistor coupled between said intimidate output and said third terminal of said transistor, said variable resistor being responsive to said magnitude control output from said duty cycle monitoring means.

18. The oscillator of claim 13 further including a switching means coupled between said intermediate output node and said third terminal of said transistor, said switching means being responsive to said duty cycle monitoring means and effective for isolating said intermediate output node from said transistor in response to said oscillating signal being at said first logic state for a predetermined amount of time.

19. The oscillator of claim 18 wherein said switching means is responsive to said magnitude control output from said duty cycle monitoring means.

20. The oscillator of claim 13 wherein said intermediate output node is coupled to a noninverting amplifier.

21. The oscillator of claim 13 further including a noninverting amplifier circuit responsive to said logic inverter and effective for producing an output clock pulse having a duty cycle substantially similar to said predetermined second duty cycle.

22. The oscillator of claim 13 wherein said coupling means for coupling said magnitude control output to said first control input of said variable current source is a low pass filter.

23. The oscillator of claim 22 wherein said low pass filter includes a capacitor coupled between said first control input of said variable current source and said second power rail.

24. The oscillator of claim 13 further including a crystal oscillator circuit for producing said oscillating signal, said crystal oscillator circuit including a crystal, a resistor, a first capacitor, a second capacitor, a second transistor, and a constant current source;

said crystal and said resistor being coupled in parallel between a first oscillator node and a second oscillator node, said first capacitor being coupled between said first oscillator node and said second power rail, said second capacitor coupled between said second oscillator node and said second power rail;

said transistor having a source electrode, a drain electrode and a control gate, said source electrode being coupled to said second power rail, said drain electrode being coupled to said second oscillator node and said control gate being coupled to said first oscillator node, said constant current source being coupled between said drain electrode and said first power rail.

25. An oscillator with controlled duty cycle comprising:

a first power rail and a second power rail;

a variable current source having a first terminal, a second terminal, and a first control input, said first terminal being coupled to said first power rail, said second terminal being coupled to an intermediate output node;

a first transistor having a third terminal, a fourth terminal, and a second control input, said third terminal being coupled to said intermediate output node;

a first switching means having a fifth terminal and a sixth terminal, and further having a third control input for receiving an oscillating signal having a first duty cycle and oscillating between a first logic state and a second logic state, said fifth terminal being coupled to said fourth terminal of said first transistor, said sixth terminal being coupled to said second power rail, said first switching means being effective for closing and coupling said fifth terminal to said second power rail in response to said oscillating signal being at said first logic state and effective for opening and isolating said fifth terminal from said second power rail in response to said oscillating signal being at said second logic state;

a duty cycle monitoring means for triggering a magnitude control output in response to said oscillating signal being at said first logic state, the triggering of said magnitude control output causing it to vary with time in a manner indicative of time, said magnitude control output being coupled to said second control input, said first transistor being effective for isolating said intermediate output node from said first switching means in response to said oscillating signal being at said first logic state for a predetermined amount of time;

coupling means for coupling said magnitude control output to said first control input of said variable current source.

26. The oscillator of claim 25 wherein said variable current source is effective for generating a current magnitude proportional to said magnitude control output and effective for moving the voltage potential of said intermediate output node toward said first power rail at a rate dependent on said current magnitude.

27. The oscillator of claim 25 wherein said duty cycle monitoring mean is coupled to said third control input of said first switching means and effective for observing said oscillating signal directly.

28. The oscillator of claim 25 wherein said duty cycle monitoring mean is coupled to monitor said intermediate output node.

29. The oscillator of claim 25 further including a variable resistor coupled between said first terminal of said variable current source and said first power rail, said variable resistor being responsive to a power and temperature insensitive control circuit.

30. The oscillator of claim 25 wherein said intermediate output node is coupled to an amplifier.

31. The oscillator of claim 25 wherein said first control input of said variable current source is connected to said second control input of said first transistor.

32. The oscillator of claim 31 wherein said first switching means is a second transistor.

33. The oscillator of claim 32 wherein said first and second transistors are MOS transistors.

34. The oscillator of claim 31 wherein said duty cycle monitoring means includes a logic inverter, a current starved inverter, a first constant current source having a first control current, and a second constant current source having a second control current;

said logic inverter being responsive to said intermediate output node, the output of said logic inverter being coupled to said current starved inverter, said current starved inverter having a pull-up rate dependent on said first control current and having a pull-down rate dependent on said second control current, said current starved inverter being effective for generating said magnitude control output, the ratio of said first control current to said second control current being effective for establishing a predetermined second duty cycle at said intermediate output node.

35. The oscillator of claim 34 further including a non-inverting amplifier circuit responsive to said logic inverter for producing an output clock pulse having a duty cycle substantially similar to said predetermined second duty cycle.

36. The oscillator of claim 34 wherein said coupling means for coupling said magnitude control output to said first control input of said variable current source is a low pass filter.

37. The oscillator of claim 36 wherein said low pass filter includes a capacitor coupled between said first control input of said variable current source and said second power rail.

38. The oscillator of claim 36 wherein said variable current source is a second transistor and said first switching means is a third transistor.

39. The oscillator of claim 38 further including a power and temperature insensitive current source, a first current mirror, a second current mirror, a third current mirror, and a crystal oscillator circuit;

said crystal oscillator circuit being effective for producing said oscillating signal and further including a crystal, a resistor, a first capacitor, a second capacitor, a fourth transistor, and a fourth current mirror, said crystal and said resistor being coupled in parallel between a first oscillator node and a second oscillator node, said first capacitor being coupled between said first oscillator node and said second power rail, said second capacitor coupled between said second oscillator node and said second power rail, said fourth transistor having a source electrode, a drain electrode and a control gate, said source electrode being coupled to said second power rail, said drain electrode being coupled to said second oscillator node and said control gate being coupled to said first oscillator node, said fourth current mirror being coupled between said drain electrode and said first power rail and being effective for providing a first reference current proportional to said power and temperature insensitive current source;

said first current mirror being coupled between said first power rail and said variable current source and being effective for providing a second reference current proportional to said power and temperature insensitive current source;

said second current mirror being said first constant current source and said first control current being proportional to said power and temperature insensitive current source;

said third current mirror being said second constant current source and said second control current being proportional to said power and temperature insensitive current source.

\* \* \* \* \*